United States Patent [19]

Yamashita et al.

[11] Patent Number: 4,696,192
[45] Date of Patent: Sep. 29, 1987

[54] FLUID PRESSURE SENSOR

[75] Inventors: Ichiro Yamashita, Hirakata; Masayuki Wakamiya, Suita; Hiroyuki Hase, Katano; Shinya Tokuono, Ashiya, all of Japan

[73] Assignee: Matsushita Electric Industrial Co., Ltd., Osaka, Japan

[21] Appl. No.: 882,535

[22] Filed: Jul. 7, 1986

[30] Foreign Application Priority Data

Jul. 4, 1985 [JP] Japan ................. 60-147526

[51] Int. Cl.<sup>4</sup> ............... G01L 7/08; G01L 9/16
[52] U.S. Cl. ................. 73/728; 73/DIG. 2; 336/20; 336/30
[58] Field of Search ......... 73/DIG. 2, 728, 722, 73/862.69, 779; 336/20, 30, 135; 324/209

[56] References Cited

U.S. PATENT DOCUMENTS 4,412,454 11/1983 Yamashita et al. ............. 73/728
4,625,562 12/1986 Yamashita et al. ............. 73/DIG. 2

Primary Examiner—Donald O. Woodiel
Attorney, Agent, or Firm—Wenderoth, Lind & Ponack

[57] ABSTRACT

A fluid pressure sensor includes a body made of a soft magnetic material with a groove formed therein, and a coil is installed in the body in the groove. One magnetostrictive disc is placed on the body over the groove, and two non-magnetic discs are placed over the magnetostrictive disc. A casing is provided for accommodating the body carrying the coil, the magnetostrictive disc, and the non-magnetic discs, and it is closed by a lid member which has a surface for receiving a fluid pressure. A plurality of through holes are formed in the lid member within the fluid pressure receiving surface such that the through holes extend to the non-magnetic disc at position over the groove, whereby the magnetostrictive plate is partially distorted by the fluid pressure.

9 Claims, 4 Drawing Figures

FLUID PRESSURE SENSOR

BACKGROUND OF THE INVENTION

1. Field of the Invention

The present invention relates to a fluid or hydraulic pressure sensor suitable for sensing high fluid pressure and, more particularly, to a sensor for sensing pressure utilizing magnetostrictive effect generated by an amorphous magnetic alloy.

2. Description of the Prior Art

A fluid pressure sensor using a magnetostrictive effect generated by an amorphous magnetic alloy has been already proposed, and it is often used for measuring oil pressure. FIG. 1 shows a cross-sectional view of a conventional fluid sensor in which 12 indicates a magnetostrictive disc plate made of an amorphous alloy and having a thickness of about several tens of micrometers; 13 is a cylindrical body made of a soft magnetic material; 14 is a coil disposed on an annular groove 13a formed in cylindrical body 13; 15 is a housing in which the above-described members are provided; 16 is an O-ring which prevents oil from flowing out along the surface of magnetostrictive disc plate 12; 17 is an inlet for introducing oil; 18 is a through hole for the oil passage; and 19 is a circuit coupled with coil 14 for measuring inductance. Cylindrical body 13 and magnetostrictive disc plate 12 define a magnetic circuit for the magnetic flux generated by coil 14.

When the fluid pressure P is introduced from inlet 17 through holes 18 to amorphous alloy magnetostrictive disc plate 12, plate 12 partially distorts, such as to produce dimples shown by a broken line, thereby changing the magnetic permeability. As a result, the number of lines of force, representing the magnetic field as generated by coil 14, decreases. Accordingly, the inductance of the magnetic circuit, as measured by coil 14, varies relatively to the pressure applied to magnetostrictive disc plate 12.

According to the prior art pressure sensor as described above, since magnetostrictive disc plate 12 is very thin, it may be deteriorated after a long period of use or when it receives a very high pressure such that magnetostrictive disc plate 12 loses it elasticity to stay in the distorted shape even after the pressure is removed. Also, since magnetostrictive disc plate 12 is exposed to the oil coming from holes 18, magnetostrictive disc plate 12 may corrode after some period of use.

SUMMARY OF THE INVENTION

The present invention has been developed with a view to substantially solving the above described disadvantages and has for its essential object to provide an improved fluid pressure sensor which is so arranged as to prevent the magnetostrictive disc plate from being deteriorated by the pressure or corroding by the oil.

It is also an essential object of the present invention to provide a fluid pressure sensor of the above described type which can be readily manufactured.

In accomplishing these and other objects, a fluid pressure sensor according to the present invention comprises a body made of a soft magnetic material with a groove formed therein, and a coil is installed in the body in the groove. At least one magnetostrictive plate is placed on the body over the groove, and at least one non-magnetic plate is placed over the magnetostrictive plate. A casing is provided for accommodating the body carrying the coil, the magnetostrictive plate, and the non-magnetic plate, and it is closed by a lid member which has a surface for receiving a fluid pressure. At least one through hole is formed in the lid member within the fluid pressure receiving surface such that the through hole extends to the non-magnetic plate at position over the groove, whereby the magnetostrictive plate is partially distorted by the fluid pressure.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 2:
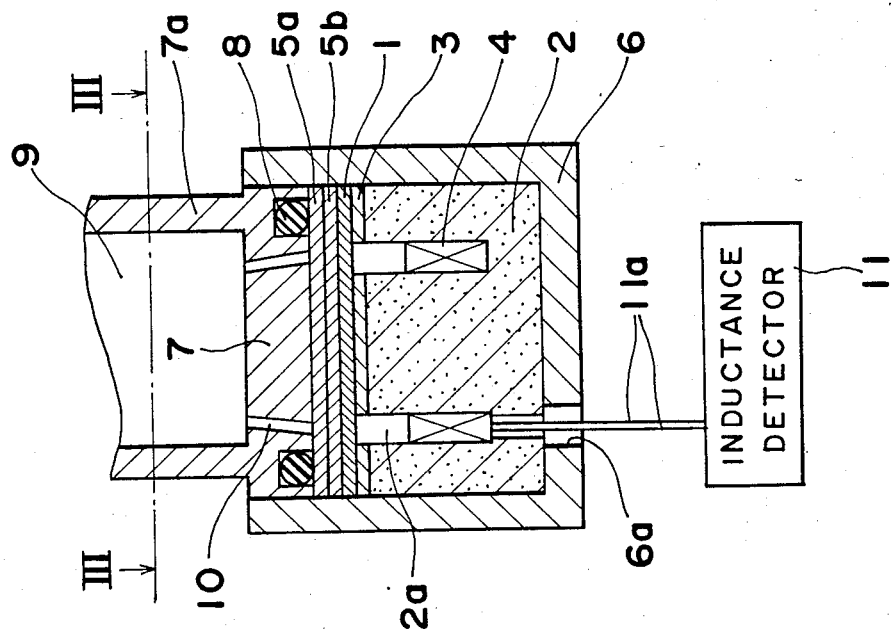
FIG. 2 is a cross-sectional view of a fluid pressure sensor according to a preferred embodiment of the present invention.
Figure 3:
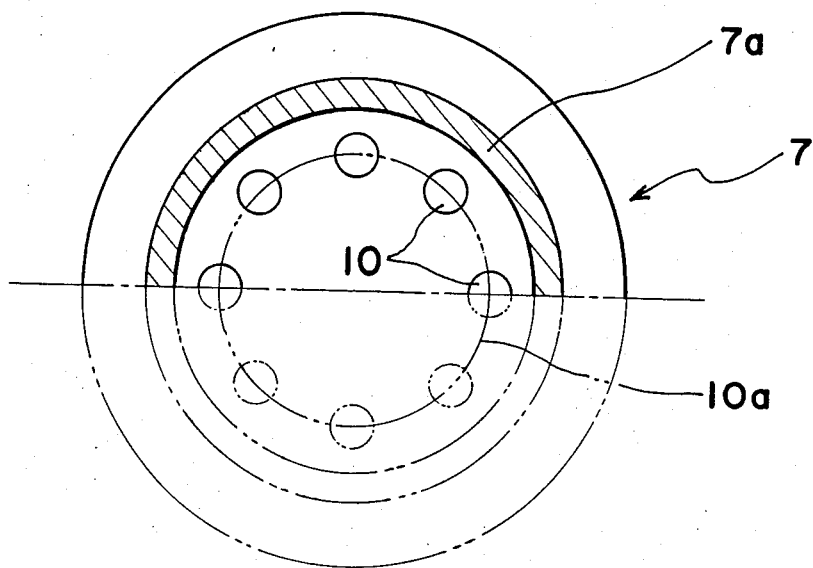
FIG. 3 is a cross-sectional view taken along a line III—III shown in FIG. 2.

Referring to FIG. 2, a cross-sectional view of a fluid pressure sensor, particularly the transducer portion, according to the invention is shown. The fluid pressure sensor according to the present invention comprises a cylindrical housing 6 having one end opened and the other end closed. The closed end of housing 6 is formed with a small through-hole 6a for extending wires 11a. The open end of housing 6 is closed by a lid member 7 having an annular wall 7a extending outwardly and in the axial direction of cylindrical housing 6. The end (not shown) of the annular wall 7a is connected to a conduit (not shown) for introducing a fluid, such as oil, on top of lid member 7. As best shown in FIG. 3, lid member 7 has a plurality of through-holes 10 formed therein inside the annular wall 7a along an imaginary circle line 10a. Through-holes 10 may be slanted, such as shown in FIG. 2, or they may be extended parallel to the axis of the housing. Also, an O-ring 8 is mounted at the periphery of lid member 7.

Provided inside housing 6 are cylindrical body 2, spacer 3, a magnetostrictive disc 1, and two non-magnetic discs 5a and 5b, each of which is described below.

Cylindrical body 2 is made of a soft magnetic ferrite and has an annular groove 2a formed therein in alignment with imaginary circle line 10a for rigidly accommodating therein a coil 4 connected to an inductance detector 11 through wires 11a.

Figure 4:
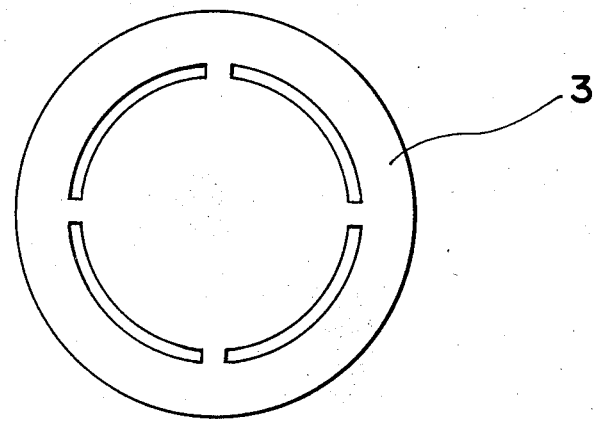
FIG. 4 is a top plan view of a spacer shown in FIG. 2.

Spacer 3, as best shown in FIG. 4, is placed on cylindrical body 2 and has elongated openings 7a formed along annular groove 2a. Spacer 3 is made of metal.

Magnetostrictive disc 1 is made of an amorphous alloy, such as a $(Fe_{0.95}Cr_{0.05})_{78}Si_{10}B_{12}$, and has a thickness of about several tens of micrometers. In the embodiment shown in FIG. 2, only one magnetostrictive disc 1 is provided, but it is possible to provide a plurality of magnetostrictive disc placed one over the other.

Non-magnetic discs 5a and 5b are made of an amorphous alloy, such as a $Ni_{70}Cr_{10}P_{15}B_5$, a $Ti_{50}Cu_{45}P_5$, or a $Ni_{34}Cr_{24}Mo_{24}C_{18}$, and each has a thickness similar to the magnetostrictive disc. The number of the non-magnetic discs is not limited to two, but can be any other number, such as one, three, four or greater.

The fluid pressure sensor as described above operates in the following manner.

It is assumed that the fluid, e.g., oil, filled in annular wall 7a is applied with no pressure. In this case, no distortion is present in magnetostrictive disc 1, as well as in any of non-magnetic discs 5a and 5b. Thus, when a current is applied to coil 4, a predetermined number of magnetic fluxes are produced there around passing through cylindrical body 2 and magnetostrictive disc 1.

Then, when a certain amount of pressure is applied to the oil, the pressure is transmitted through the oil in through-holes 10 and also through non-magnetic discs 5a and 5b to magnetostrictive disc 1, thereby making dimples in magnetostrictive disc 1. Thus, the magnetic permeability of magnetostrictive disc 1 changes to reduce the number of magnetic flux as generated by coil 4, thereby changing the current flowing though coil 4. Such a current change can be detected as an inductance change of coil 4 together with its associated parts, e.g., 1 and 2. Therefore, by detecting the inductance change, the pressure applied to the oil can be detected.

Spacer 3 is provided to help making dimples at a degree corresponding to the applied pressure, and also to help magnetostrictive disc 1 returning back to its original shape when the pressure is removed.

According to the present invention, since one or more non-magnetic discs 5a and 5b are provided between lid member 7 and magnetostrictive disc 1, magnetostrictive disc 1 will not be expose to the oil, thereby preventing the magnetostrictive disc from corroding. Also, magnetostrictive disc 1 is reinforced by non-magnetic discs 5a and 5b, so that disc 1 will not easily lose the elasticity by the applied pressure. This will enable the measuring of a higher pressure, as explained below.

Figure 1:
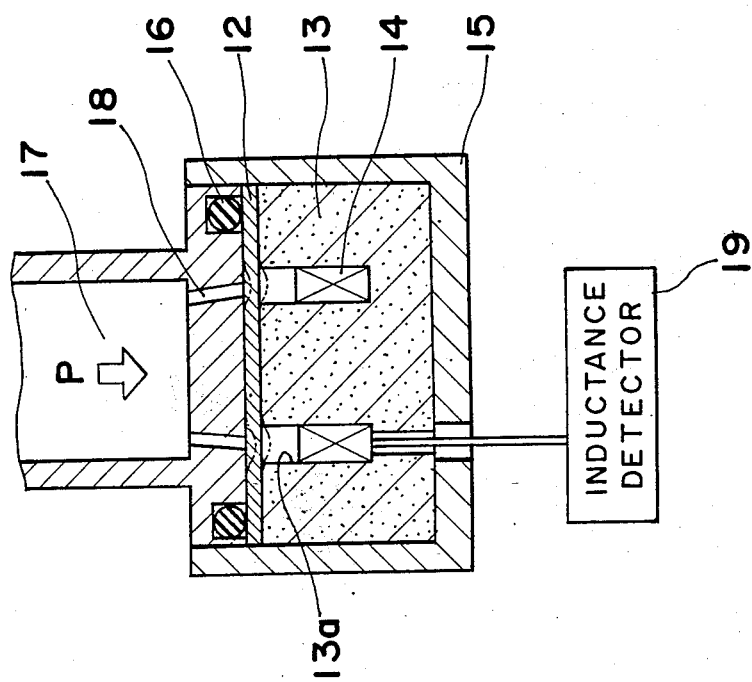
FIG. 1 is a cross-sectional view of a prior art fluid pressure sensor using an amorphous magnetic alloy.

According to the present invention, since the pressure applied to the oil is received by magnetostrictive disc 1 through non-magnetic discs 5a and 5b, the degree of the distortion generated in these discs is as low as half or less as compared with that of the prior art described above in connection with FIG. 1. Thus, it is possible to detect several times greater pressures without deteriorating magnetostrictive disc 1.

Since no magnetic flux passes through non-magnetic discs 5a and 5b, the magnetic circuit is defined by cylindrical body 2, spacer 3 and magnetostrictive disc 1, which are substantially the same as the elements that define the magnetic circuit in the prior art pressure sensor. Therefore, the same inductance detector as that used in the prior art can be used for the pressure sensor of the present invention. Furthermore, the same inductance detector can be used even if the number of the non-magnetic disc is changed, provided that the measuring range should be changed.

For example, the inductance detector used in the prior art pressure sensor employs an A.C. current which is added with a D.C. current so as to select an optimum operating level. Since there is no change in the magnetic circuit between the prior art pressure sensor and that of the present invention, the inductance detector used in the pressure sensor of the present invention also employs the A.C. current added with a D.C. current without specific change in the current amout. Therefore, the pressure sensor of the present invention operates with the same amount of power as that necessary in the prior art pressure sensor.

In summary, the fluid pressure sensor according to the present invention has the following advantages:

1. A pressure measuring range can be widened particularly to a higher pressure range.
2. Magnetostrictive disc 1 made of amorphous alloy is not exposed to the oil so that it can be prevented from corroding.
3. Magnetostrictive disc 1 is reinforced by non-magnetic disc or discs so that disc 1 can be prevented from being deteriorated by a high pressure or after a long period of use.
4. Inductance detector can be used without any substantial change in the circuit even when the measuring range is changed. For example, the D.C. current for setting the operating level of the coil excitation can be maintained in the same level as that used for the prior art pressure sensor.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claims.

What is claimed is:

1. A fluid pressure sensor comprising;
   a body made of a soft magnetic material with a groove formed therein;
   a coil installed in said body in said groove;
   at least one magnetostrictive plate placed on said body over said groove;
   at least one non-magnetic plate placed over said magnetostrictive plate;
   a casing for accommodating said body carrying said coil, said magnetostrictive plate, and said non-magnetic plate; and
   a lid member for closing said casing, said lid member having a surface for receiving a fluid pressure and at least one through hole formed in said lid member within said fluid pressure receiving surface, said through hole extending to said non-magnetic plate at position over said groove, whereby said magnetostrictive plate is partially distorted by said fluid pressure.

2. A fluid pressure sensor as claimed in claim 1, further comprising a spacer provided between said body and said magnetostrictive plate, said spacer having at least one opening for permitting said distortion of said magnetostrictive plate.

3. A fluid pressure sensor as claimed in claim 1, further comprising an inductance detector for exciting said coil and measuring inductance change when said fluid pressure is applied, said inductance change representing said fluid pressure.

4. A fluid pressure sensor as claimed in claim 1, wherein said magnetostrictive plate is made of amorphous alloy.

5. A fluid pressure sensor as claimed in claim 1, wherein said non-magnetic plate is made of amorphous alloy.

6. A fluid pressure sensor as claimed in claim 1, wherein said magnetostrictive plate is made of $(Fe_{0.95}Cr_{0.05})_{78}Si_{10}B_{12}$.

7. A fluid pressure sensor as claimed in claim 1, wherein said non-magnetic plate is made of any one of a $Ni_{70}Cr_{10}P_{15}B_5$, a $Ti_{50}Cu_{45}P_5$, or a $Ni_{34}Cr_{24}Mo_{24}C_{18}$.

8. A fluid pressure sensor as claimed in claim 1, wherein a plurality of magnetostrictive plates are placed on said body over said groove.

9. A fluid pressure sensor as claimed in claim 1, wherein a plurality of non-magnetic plates are placed over said magnetostrictive plate.

* * * * *